(12) United States Patent
Marchant et al.

(10) Patent No.: US 7,998,819 B2
(45) Date of Patent: Aug. 16, 2011

(54) LATERAL DRAIN MOSFET WITH IMPROVED CLAMPING VOLTAGE CONTROL

(75) Inventors: Bruce D. Marchant, Murray, UT (US); Dean Probst, West Jordan, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/849,535

(22) Filed: Aug. 3, 2010

(65) Prior Publication Data

US 2010/0317168 A1 Dec. 16, 2010

Related U.S. Application Data

(62) Division of application No. 12/352,057, filed on Jan. 12, 2009, now Pat. No. 7,781,835.

(51) Int. Cl.
*H01L 21/336* (2006.01)
(52) U.S. Cl. ........... 438/286; 438/197; 257/E21.417
(58) Field of Classification Search .......... 438/197, 438/286
See application file for complete search history.

(56) References Cited

U.S. PATENT DOCUMENTS

| 4,893,160 | A | 1/1990 | Blanchard |
| 5,814,858 | A | 9/1998 | Williams |
| 7,282,765 | B2 | 10/2007 | Xu et al. |
| 2007/0138548 | A1 | 6/2007 | Kocon et al. |

*Primary Examiner* — Zandra Smith
*Assistant Examiner* — Paul E Patton
(74) *Attorney, Agent, or Firm* — Thomas G. FitzGerald, Esq.; Hiscock & Barclay, LLP

(57) ABSTRACT

A lateral MOSFET having a substrate, first and second epitaxial layers grown on the substrate and a gate electrode formed on a gate dielectric which in turn is formed on a top surface of the second epitaxial layer. The second epitaxial layer comprises a drain region which extends to a top surface of the epitaxial layer and is proximate to a first edge of the gate electrode, a source region which extends to a top surface of the second epitaxial layer and is proximate to a second edge of the gate electrode, a heavily doped body under at least a portion of the source region, and a lightly doped well under the gate dielectric located near the transition region of the first and second epitaxial layers. A PN junction between the heavily doped body and the first epitaxial region under the heavily doped body has an avalanche breakdown voltage that is substantially dependent on the doping concentration in the upper portion of the first epitaxial layer that is beneath the heavily doped body.

11 Claims, 14 Drawing Sheets

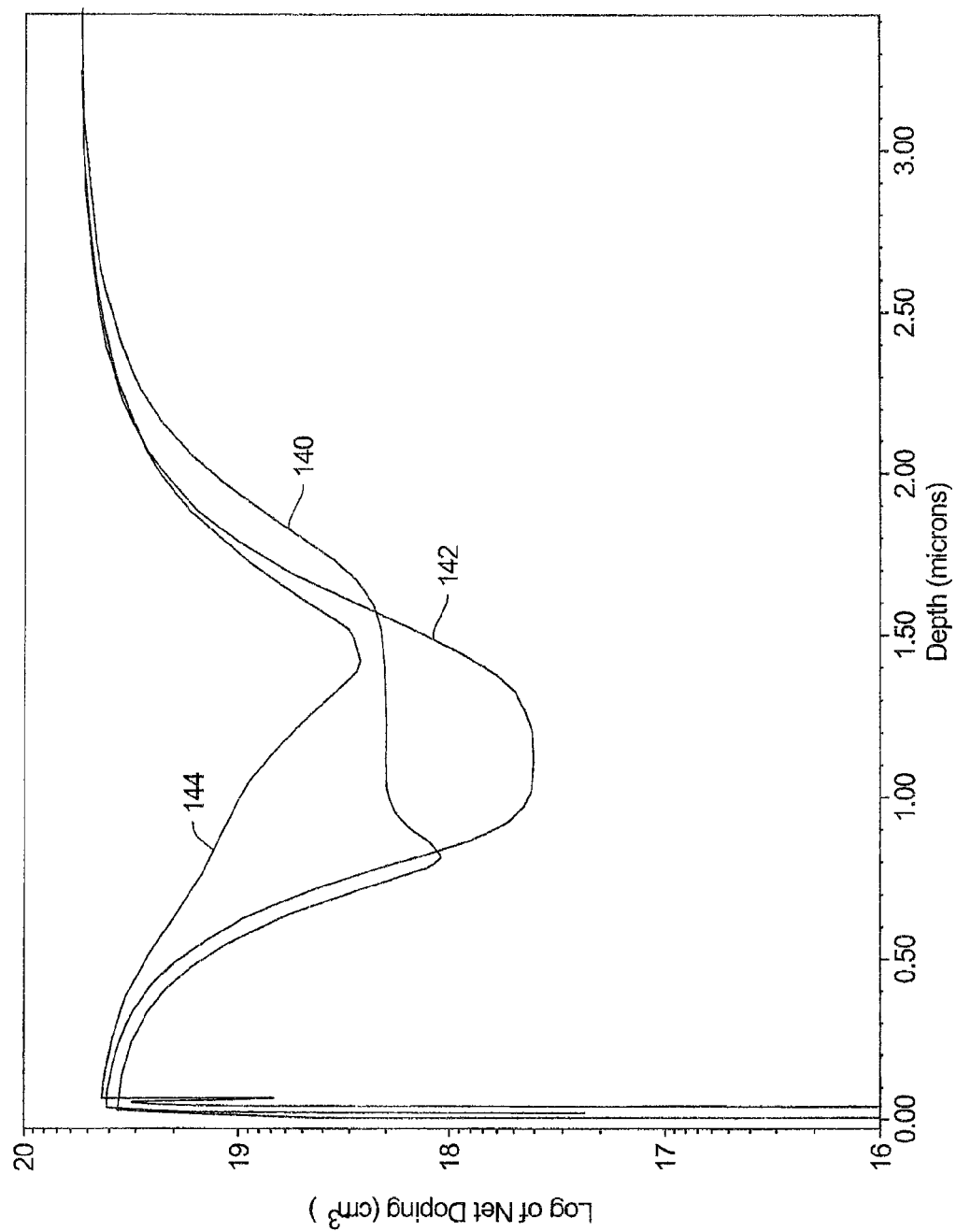

LATERAL DRAIN MOSFET WITH IMPROVED CLAMPING VOLTAGE CONTROL

CROSS-REFERENCE TO RELATED APPLICATION

This application is a divisional of U.S. patent application Ser. No. 12/352,057 filed Jan. 12, 2009 and reference is made to related U.S. patent application Ser. No. 12/339,215 filed Dec. 19, 2008, entitled "Lateral MOSFET With Substrate Drain Connection", both of which are incorporated herein in their entirety by reference.

FIELD OF THE INVENTION

This invention relates to lateral MOSFETS, and more particularly, control of the avalanche breakdown voltage of lateral MOSFETs.

BACKGROUND OF THE INVENTION

Lateral MOSFETS are susceptible to avalanche breakdown when reverse biased. Avalanche breakdown results in heating of the area around the breakdown path, and the ability to absorb the heat without damaging the MOSFET depends on the magnitude of the heat generated and the location of the avalanche breakdown path. If the breakdown current is highest at the upper surface of the MOSFET in the channel region next to the gate oxide, the gate oxide, which does not have good heat conductivity, may be damaged making the MOSFET unusable. Secondly, high avalanche current in the channel region may forward bias the well-to-source PN junction turning on a parasitic bipolar transistor inherent in the MOSFET design and putting the MOSFET into a latchup condition, further damaging the MOSFET.

As a result, areas away from the channel have been designed to go into avalanche before the channel region near the gate oxide. These areas limit or clamp the avalanche breakdown voltage to a voltage that is less than the reverse bias voltage needed to cause avalanche breakdown in the channel region. These areas are located in the bulk semiconductor material which has better heat tolerance and heat dissipation properties than the channel region.

Because all of the processing operations for forming a MOSFET are subject to inherent variations, the variations in the clamping voltage of the device must be compensated for by setting the nominal avalanche breakdown voltage in the channel region high enough so that lowest variation of the breakdown voltage in the channel is always greater than the highest variation in the breakdown voltage in the avalanche clamping voltage region. The avalanche breakdown voltage in the channel is determined by the dopant concentrations of the channel region and the drain region near the channel. A lower dopant concentration provides a higher avalanche breakdown voltage, but also increases the on resistance of the MOSFET. If the variations in the clamping voltage can be tightly controlled, the dopant levels in the drain region near the channel can be increased and the specified on resistance of the MOSFET can be lowered compared to MOSFETs without tight variations in the clamping voltages.

SUMMARY OF THE INVENTION

The invention comprises, in one form thereof, a lateral MOSFET having a substrate of a first conductivity type, a first epitaxial layer of the first conductivity type grown on the substrate, a second epitaxial layer grown on the first epitaxial layer, and a gate electrode formed on a gate dielectric which in turn is formed on a top surface of the second epitaxial layer. The second epitaxial layer comprises a drain region of the first conductivity type which extends to a top surface of the epitaxial layer and is proximate to a first edge of the gate electrode, a source region of the first conductivity type which extends to a top surface of the second epitaxial layer and is proximate to a second edge of the gate electrode, a heavily doped body of a second conductivity type opposite to the first conductivity type under at least a portion of the source region, and a lightly doped well of the second conductivity type under the gate dielectric which extends to the heavily doped body. A PN junction lying between the heavily doped body and the first epitaxial region under the heavily doped body defines a voltage clamping region, and a reverse bias voltage that is slightly less than a breakdown voltage applied to said PN junction in the voltage clamping region creates a depletion region that extends to a region of the first epitaxial layer in which the vertical dopant concentration is substantially constant.

In still another form, the invention includes a method for forming a lateral MOSFET. The method comprises the steps of growing a first epitaxial layer on a substrate, the first epitaxial layer and the substrate being of a first conductivity type, growing a second epitaxial layer on the first epitaxial layer, forming a gate electrode on a gate dielectric which in turn is formed on a top surface of the second epitaxial layer, forming a drain region of the first conductivity type in the second epitaxial layer which extends to a top surface of the epitaxial layer and is proximate to a first edge of the gate electrode, forming a source region of the first conductivity type in the second epitaxial layer which extends to a top surface of the second epitaxial layer and is proximate to a second edge of the gate electrode, forming a heavily doped body of a second conductivity type in the second epitaxial layer opposite to the first conductivity type under at least a portion of the source region, and forming a lightly doped well of the second conductivity type in the second epitaxial layer under the gate dielectric which extends to the heavily doped body. A PN junction lying between the heavily doped body and the first epitaxial region under the heavily doped body defines a voltage clamping region, and a reverse bias voltage that is slightly less than a breakdown voltage applied to said PN junction in the voltage clamping region creates a depletion region that extends to a region of the first epitaxial layer in which the vertical dopant concentration is substantially constant.

BRIEF DESCRIPTION OF THE DRAWINGS

The aforementioned and other features, characteristics, advantages, and the invention in general will be better understood from the following more detailed description taken in conjunction with the accompanying drawings, in which:

FIG. 6 is a graph of the simulated net dopant concentrations in the drain region of a conventionally design lateral MOSFET, the lateral MOSFETs of FIG. 1, and the lateral MOSFET of FIG. 5.

Figure 1:
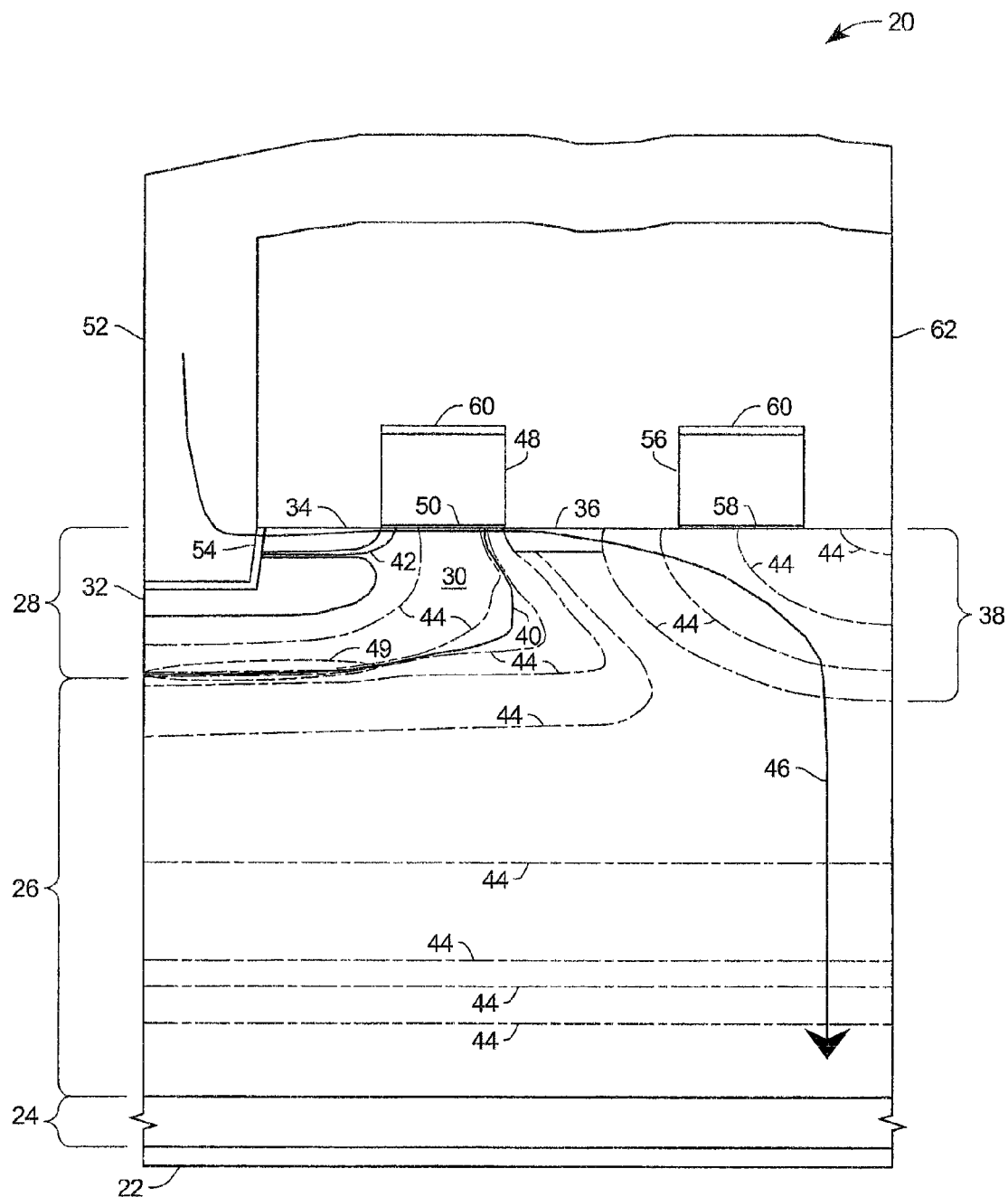
FIG. 1 is a side diagrammatical view of an embodiment of a lateral MOSFET according to the present invention.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

Turning now to the drawings, FIG. 1A is a side diagrammatical view of an embodiment of a lateral MOSFET 20 according to the present invention. The lateral MOSFET 20 includes a substrate drain connection 22, which may be a metallization, a heavily doped substrate 24 of a first conductivity type which has grown thereon a little less heavily doped first epitaxial (epi) layer 26 of the first conductivity type, and a second epitaxial layer 28. The substrate 24 and the first and second epitaxial layers 26, 28 form a monocrystalline semiconductor body. Although the first conductivity type can be N type or P type, for ease of discussion the first conductivity type will hereinafter be referred to as N type, and a second conductivity type, opposite to the first conductivity type, will therefore be referred to hereinafter as P type. The second epitaxial layer 28 is initially N type that is more lightly doped than the substrate 24 or the first epitaxial layer 26, and contains a P well 30, a heavy P body 32, a heavily doped N-type source region 34 which extends to the upper surface of the second epitaxial layer 28, a low doped drain (LDD) region 36, and a sinker 38, sometimes referred to herein as the down sinker 38. The line 40 indicates the PN junction between the P well 30 and the N-type second epitaxial layer 28 and the line 42 indicates the PN junction between the source region 34 and the P well 30. The long and short dashed lines 44 indicated selected simulated dopant concentration counters in on embodiment of the present invention, and the line 46 shows the main current path of one embodiment of the lateral MOSFET 20.

An active gate electrode 48 is above the second epitaxial layer 28 and is separated from the second epitaxial layer 28 by a gate oxide 50. The heavy P body 32 lies under the source region 34 and extends laterally further under the active gate electrode 48 in the embodiment shown if FIG. 1A. The P well 30 extends down from the gate oxide 50 and under the heavy P body 32.

Metallization 52 extends down into, and contacts, the heavy P body 32 and the source region 34 through a silicide layer 54.

A second non-active gate electrode 56 lies over the sinker 38 with a gate oxide 58 lying between the top of the second epitaxial layer 28 and the non-active gate electrode 56. Both the active gate electrode 44 and the non-active gate electrode 56 may be polysilicon with silicide layers 60 on the top surfaces of the two gate electrodes 48, 56. An interlevel dielectric 62 separates the metallization 48 from the gate electrodes 48, 56 and the top surface of the second epitaxial layer 28.

The non-active gate electrode 56 is used as a portion of the mask for the implant to form the sinker 38, and thus the distance from the edge of the exposed region of the top surface of the second epitaxial layer 28 which will be implanted to form the sinker 38 to the edge of the active gate electrode 48 is set by a single mask. Without the non-active gate electrode 56, the distance from the exposed region of the of the top surface of the second epitaxial layer 28, which will be implanted to form the sinker 38. Those skilled in the art will understand that the non-active gate electrode 56, while formed with the same etch mask used to form the active gate electrode 48, only has to be wide enough to compensate for the mask variations in the photoresist mask used to pattern the photoresist which is used to implant the sinker 38. Thus it may be possible that the non-active gate electrode 56 may be of a different material than the active gate electrode 48, and may have a shape different from the active gate electrode 48.

To provide a more robust MOSFET the location where avalanche breakdown under reverse bias conditions occurs is a voltage clamping region indicated by the dashed line 49 in the monocrystalline silicon that is away from the gate oxide 50. The gate oxide 50 is susceptible to damage from heat generated during avalanche breakdown. The location for the lateral MOSFET 20 is the PN junction 40 under the heavy P body 32 which is relatively deep inside the monocrystalline body.

Figures 2A, 2B:
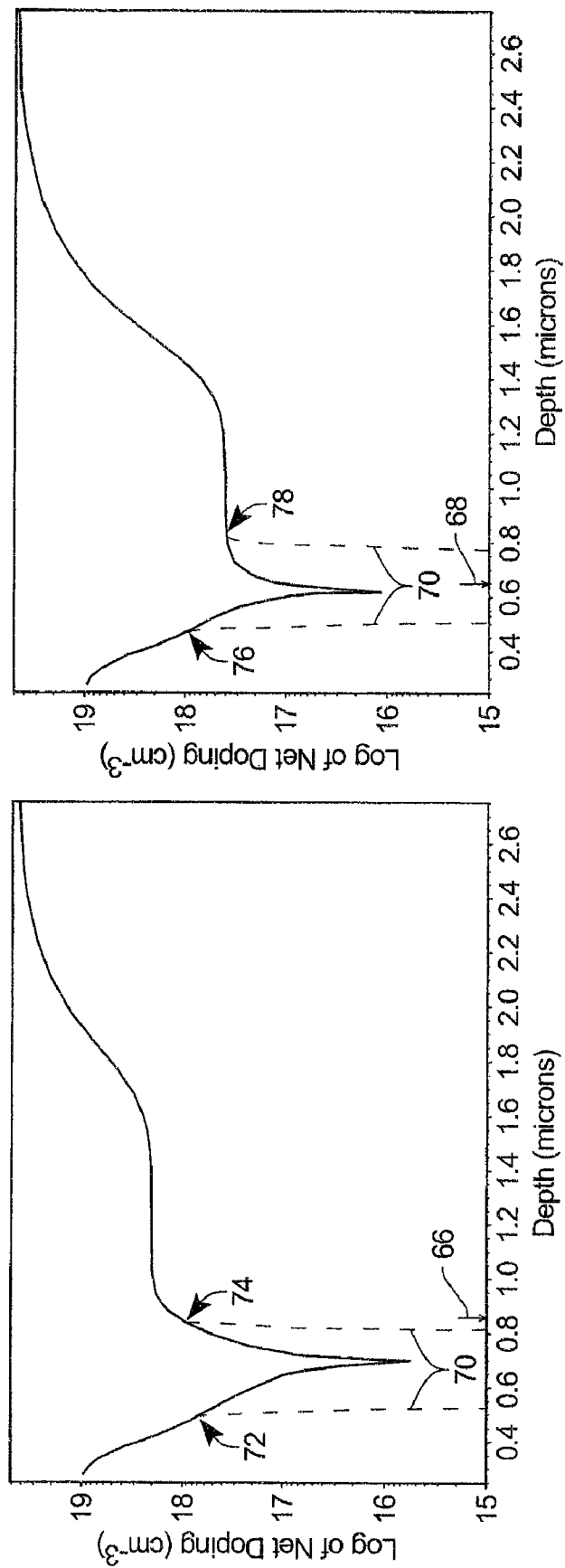
FIGS. 2A and 2B are plots of the simulated net dopant concentration profiles through a clamping region of a conventional designed lateral MOSFET and the lateral MOSFET of FIG. 1, respectively.

FIGS. 2A and 2B are plots of the simulated net dopant concentration profiles from the top of the epitaxial layer 28 on the left end of the plots to the bottom of the first epitaxial layer 26 on the left end of the plots of a conventional designed lateral MOSFET and the lateral MOSFET 20 of FIG. 1, respectively. The plots are through the heavy P body 38 under the silicide 54 which includes the voltage clamping region 49. FIG. 2A is a plot resulting from a more conventional design of the first and second epitaxial layers 26, 28, while FIG. 2B is a plot resulting from an embodiment of the present invention. In the more conventional design, the first epitaxial layer is heavily doped to provide a low resistivity path through the first epitaxial layer for the current through the MOSFET, and the depth of the second epitaxial layer 28 is set for the desired avalanche breakdown voltage in the region 49. As a result, in one conventional design the net dopant concentration of the first epitaxial layer, when it is formed, is doped to provide a resistivity of about 0.015 ohm-cm, and the thickness of the second epitaxial layer is set at 0.86 μm.

Dashed lines 70 indicate the depletion boundaries at the target avalanche breakdown voltage, and lines 66 and 68 show the boundary between the first epitaxial layer 26 and the second epitaxial layer 28 in FIGS. 2A and 2B. As shown in FIG. 2A both of the depletion boundaries are in the second epitaxial layer 28. The net dopant concentration at the left dashed line of the depletion region in FIG. 2A, indicated by reference number 72, is about $7e17$ $cm^{-3}$, and the net dopant concentration at the right dashed line of the depletion region in FIG. 2A, indicated by reference number 74, is about $9e17$ $cm^{-3}$.

In FIG. 2B the left depletion boundary is in the second epitaxial layer 28, and the right depletion boundary is in the first epitaxial layer 26. The net dopant concentration at the left dashed line of the depletion region in FIG. 2B, indicated by reference number 76, is about $1e19$ $cm^{-3}$, and the net dopant concentration at the right dashed line of the depletion region in FIG. 2B, indicated by reference number 78, is about $4e17$ $cm^{-3}$.

In the more conventional design of FIG. 2A the net dopant concentration of the left edge of the depletion region at 72 is less than the net dopant concentration on the right edge of the depletion region at 74, and the difference between the two net dopant concentrations is less than the difference in the net dopant concentrations at the edges 76, 78 of the depletion region shown in FIG. 2B. Also, in FIG. 2B the right edge net dopant concentration 78 is less than the left edge net dopant concentration 76.

The present invention provides for less variation in the avalanche breakdown voltage during processing of wafers of the lateral MOSFETs 20 compared to the more conventional design. The breakdown voltage variation in the voltage clamping region 49 is calculated based on variations of three parameters during the fabrication of wafers of the lateral MOSFETs 20: the thickness and resistivity of the second epitaxial layer 28 and the resistivity of the first epitaxial layer 26.

The +/−4 sigma variations in these parameters, based on simulations, for the more conventional design is used to provide a combined +/−4 sigma variation of the breakdown voltage, BVDSS, of 2.71 volts, which is the square root of the sum of the squares of the individual variations in BVDSS of the three parameters, as shown in table 1:

TABLE 1

| Parameter | Target | +/−4 sigma | BVDSS Range |
|---|---|---|---|
| Second epi layer thickness | 0.86 μm | +/−6% | 2.69 V |
| Second epi layer resistivity | 2 ohm-cm | +/−6% | 0.00 V |
| First epi layer resistivity | 0.015 ohm-cm | +/−6% | 0.32 V |
| Combined BVDSS range: | | | 2.71 V |

With the present invention, as represented in FIG. 2B, the resistivity of the first epitaxial layer 26 is greater than the dopant concentration in the more conventional design, and the thickness of the second epitaxial layer is less. The doping profile represented in FIG. 2B according to one embodiment of the present invention has target parameters, and the resulting variations, based on simulations, in BVDSS are shown in table 2:

TABLE 2

| Parameter | Target | +/−4 sigma | BVDSS Range |
|---|---|---|---|
| Second epi layer thickness | 0.65 μm | +/−6% | .92 V |
| Second epi layer resistivity | 2 ohm-cm | +/−6% | 0.06 V |
| First epi layer resistivity | 0.036 ohm-cm | +/−6% | 0.64 V |
| Combined BVDSS range: | | | 1.12 V |

Figure 3B:
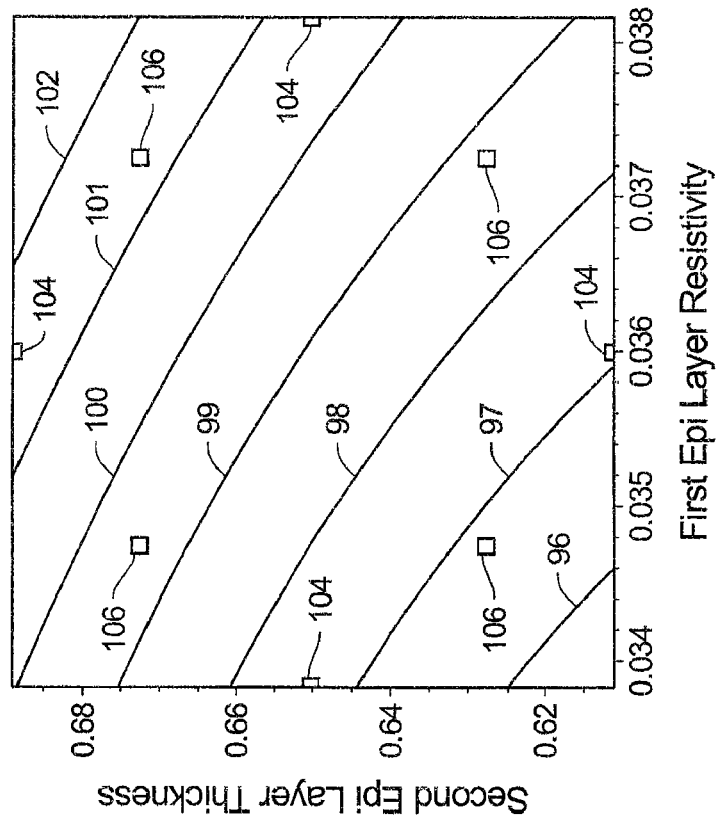
FIGS. 3A and 3B are plots of the breakdown voltages within calculated tolerance ranges for a conventional designed lateral MOSFET and the lateral MOSFET of FIG. 1, respectively.
Figure 3A:
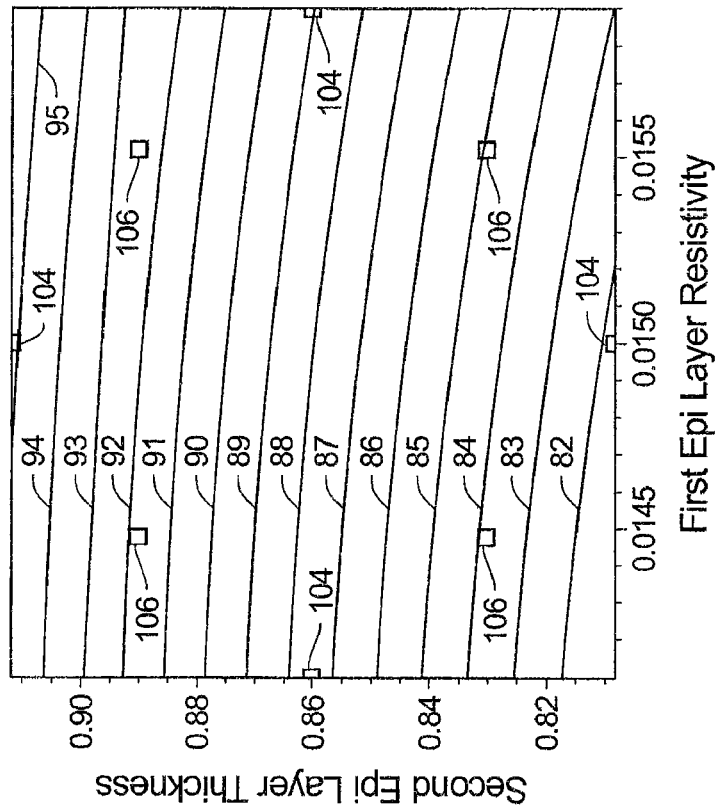

FIGS. 3A and 3B are plots of the breakdown voltages within the tolerance ranges shown in table 1 and table 2, respectively. In FIG. 3A the following reference numbers and their corresponding breakdown voltages are the following:

| Reference No. | Breakdown Voltage |
|---|---|
| 82 | 13.2 V |
| 83 | 13.4 V |
| 84 | 13.6 V |
| 85 | 13.8 V |
| 86 | 14.0 V |
| 87 | 14.2 V |

-continued

| Reference No. | Breakdown Voltage |
|---|---|
| 88 | 14.4 V |
| 89 | 14.6 V |
| 90 | 14.8 V |
| 91 | 15.0 V |
| 92 | 15.2 V |
| 93 | 15.4 V |
| 94 | 15.6 V |
| 95 | 15.8 V |

In FIG. 3B the following reference numbers and their corresponding breakdown voltages are the following:

| Reference No. | Breakdown Voltage |
|---|---|
| 96 | 12.6 V |
| 97 | 12.8 V |
| 98 | 13.0 V |
| 99 | 13.2 V |
| 100 | 13.4 V |
| 101 | 13.6 V |
| 102 | 13.8 V |

The small squares 104 in the middle of each edge represent +/−4 sigma points, as do the small squares 106 approximately in the middle of each of four quadrants in FIGS. 3A and 3B. Thus the +/−4 sigma limits do not form a rectangle, but rather a closed curve which goes through the boxes 104 and 106.

In FIG. 3A, corresponding to a more conventional design, the breakdown voltage depends almost entirely on the thickness of the second epitaxial layer, while in FIG. 3B, corresponding to one embodiment of the present invention, the breakdown voltage depends almost in equal parts on the thickness of the second epitaxial layer and on the resistivity of the first epitaxial layer. The X and Y axes represent the typical process variation for the Second Epitaxial Layer Thickness (Y axis) and First Epitaxial Layer Resistivity (X axis). Since the spacing between each contour line in FIGS. 3A and 3B represent the same amount of change in breakdown voltage, it can be seen that the overall breakdown voltage variation in FIG. 3B is significantly less that the breakdown voltage variation in FIG. 3A.

Figure 4:
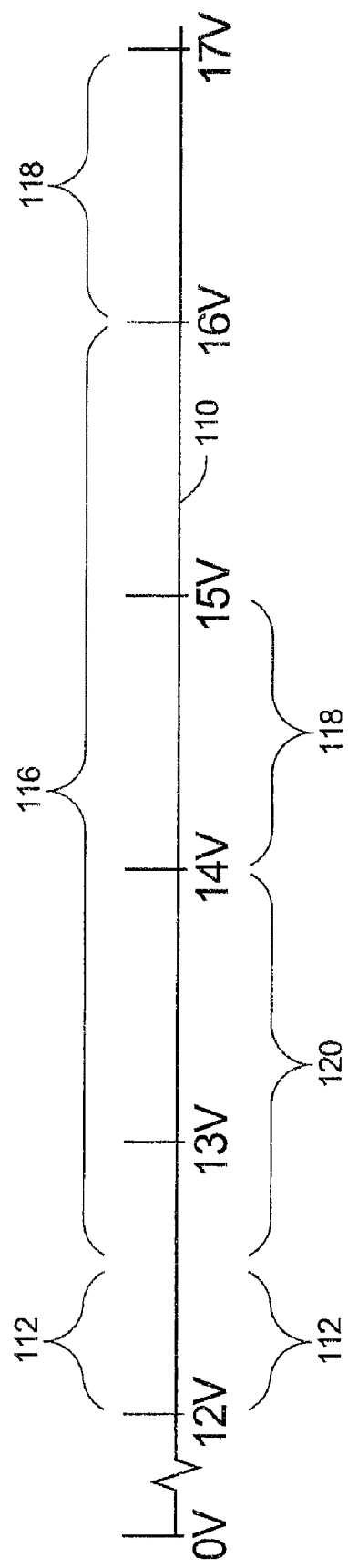
FIG. 4 is a diagram showing the resulting improvement in the breakdown voltage required for the PN junction at the gate oxide so that the PN junction at the gate oxide breaks down in a voltage clamping region and not on the top surface of the upper epitaxial layer.

FIG. 4 is a diagram showing the resulting improvement in the breakdown voltage required for the PN junction 40 at the gate oxide so that the PN junction 40 breaks down in the voltage clamping region 49 and not on the top surface of the second epitaxial layer 28 at the LDD region 36. In FIG. 4 the horizontal line 110 represents the reverse bias voltages which may be applied to the lateral MOSFET 20. In the embodiment represented in FIG. 4 the data sheet minimum breakdown voltage is 12 volts. A guard band 112 of about 0.5 volts is used in the design of the lateral MOSFET 20. Above the line 112 is the range 116 of the variation in the breakdown voltage of the more conventional design data shown in table 1. This variation extends from about 12.5 volts to around 16 volts in FIG. 4. Added to the breakdown voltage variation in the region under the heavy P body 32 is the range 118 of the variation in the breakdown voltage at the PN junction 40 at the top of the epitaxial layer 28 at the LDD region 36 which is at the drain edge of the active gate oxide 50. In FIG. 4 this variation is about 1 volt.

The doping concentrations in the channel region of the P well 30 and the LDD region 36 substantially determine the breakdown voltage under the active gate oxide 50, and a higher breakdown voltage in this region requires a more lightly doped channel region or LDD region than for a lower breakdown voltage in this region. However, the more lightly doped channel region and/or LDD region results in a higher specific on resistance (Rsp) than with a lower breakdown voltage. Rsp is an important parameter in many MOSFET applications, and thus affects the market value of the device.

Below the line 112 is the range 120 of the variation in the breakdown voltage of an embodiment of the present invention corresponding to the data shown in table 2. This variation extends from about 12.5 volts to around 14 volts in FIG. 4, the added breakdown voltage variation 118 in the breakdown voltage of the PN junction 40 at the drain edge of the channel region results in a total worst case variation required in the channel region of about 15 volts. Thus the present invention allows improved Rsp characteristics compared to the conventional design variations shown above the line 110.

The improvement in the Rsp is summarized in the following table 3 for a conventional design and two alternative embodiments of the present invention, one with, and one without, an up sinker formed at the top of the first epitaxial layer 26:

TABLE 3

| Process | Clamping Voltage Target | Channel breakdown Voltage Target | Rsp (mohm-cm$^2$) |
|---|---|---|---|
| Conventional Design | 14.4 V | 16.5 V | 54.4 |
| An Embodiment of the Present Invention Without an Up Sinker | 13.2 V | 14.4 V | 48.1 |
| An Alternative Embodiment With an Up Sinker | 13.2 V | 14.4 V | 44.7 |

Since the tightening of the variation in the breakdown voltage under the heavy P body 32 results in part from a lower dopant concentration, and therefore a higher resistivity in the first epitaxial layer 26 which affects the Rsp of the device, a buried layer or up sinker, formed in the top surface of the first epitaxial layer before the second epitaxial layer 28 is grown, can be added as described below with reference to FIG. 7A. The benefit of this option increases as the specified breakdown voltage increase. In some cases the improvement in Rsp may not justify the added processing steps required to form the up sinker.

Figure 5:
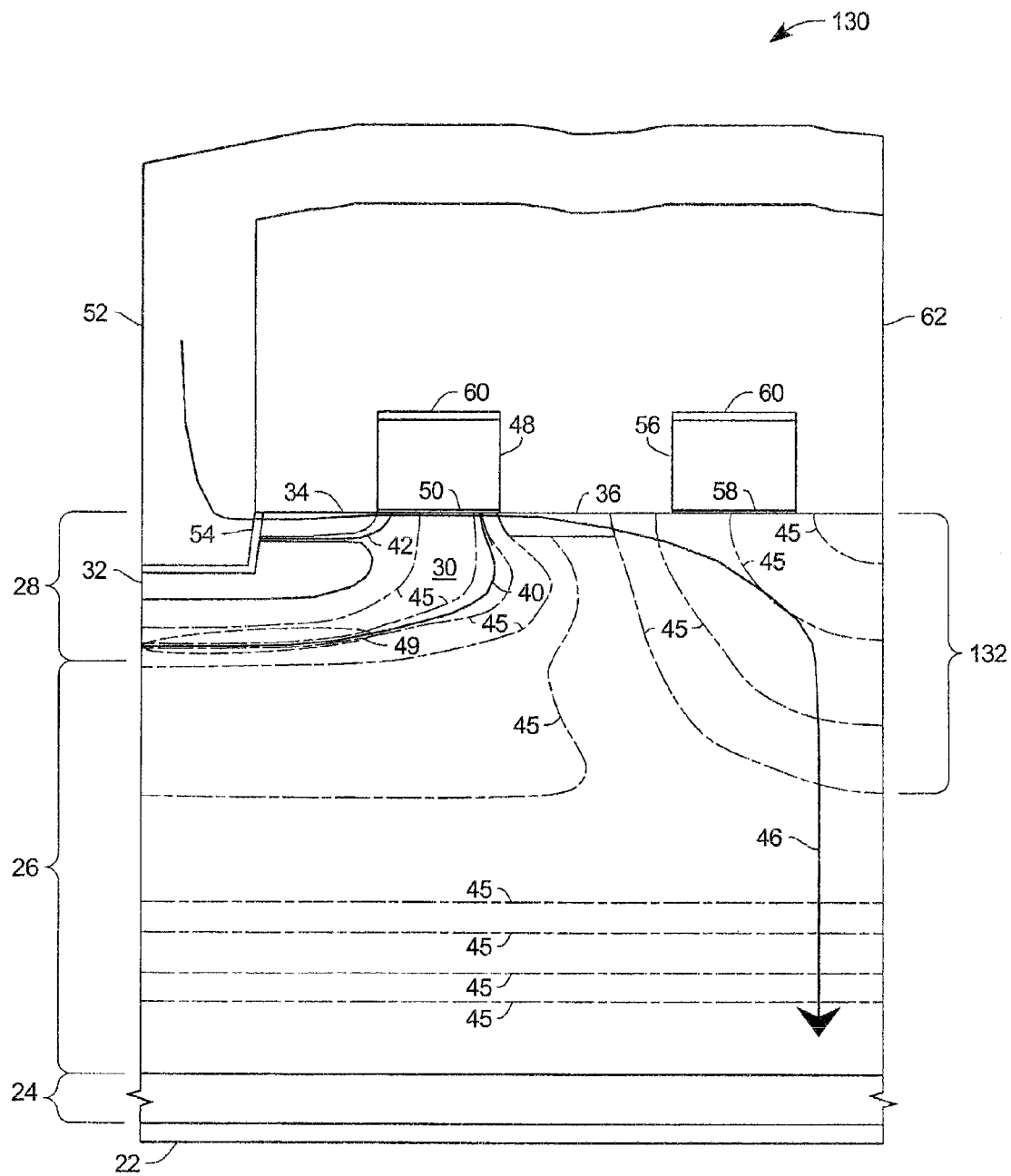
FIG. 5 is a side diagrammatical view of another embodiment of a lateral MOSFET according to the present invention.

FIG. 5 is a side diagrammatical view of an embodiment of a lateral MOSFET 130 which has been formed with an up sinker to form a drain sinker region 132. The effect of the up sinker is to extend downward the sinker 38 shown in FIG. 1 substantially without increasing the width of the sinker in the second epitaxial layer 28, and thus avoids dopants from the sinker 38 affecting the dopant concentration in the LDD region 36. Reference numbers 45 identify selected dopant level contours in FIG. 5.

FIG. 6 is a graph similar to FIGS. 2A and 2B of the simulated net dopant concentrations in the drain region of a conventionally design lateral MOSFET, the lateral MOSFET 20, and the lateral MOSFET 130. Curve 140 represents the net dopant concentration in the drain region of a conventionally designed lateral MOSFET, curve 142 represents the net dopant concentration in the drain region the lateral MOSFET 20 (without an up sinker), and curve 144 represents the net dopant concentration in the drain region in one embodiment of the lateral MOSFET 130 (with the up sinker). The net dopant concentration of curve 142, corresponding to the lateral MOSFET 20 shown in FIG. 1, has a region with a lower net dopant concentration, and therefore higher resistivity, than curve 140 corresponding to the more conventional design. However, curve 144, corresponding to the lateral MOSFET 130 shown in FIG. 5, has a higher net dopant concentration than both the lateral MOSFET 20 and the more conventional design of curves 140 and 142, respectively.

Figure 7A:
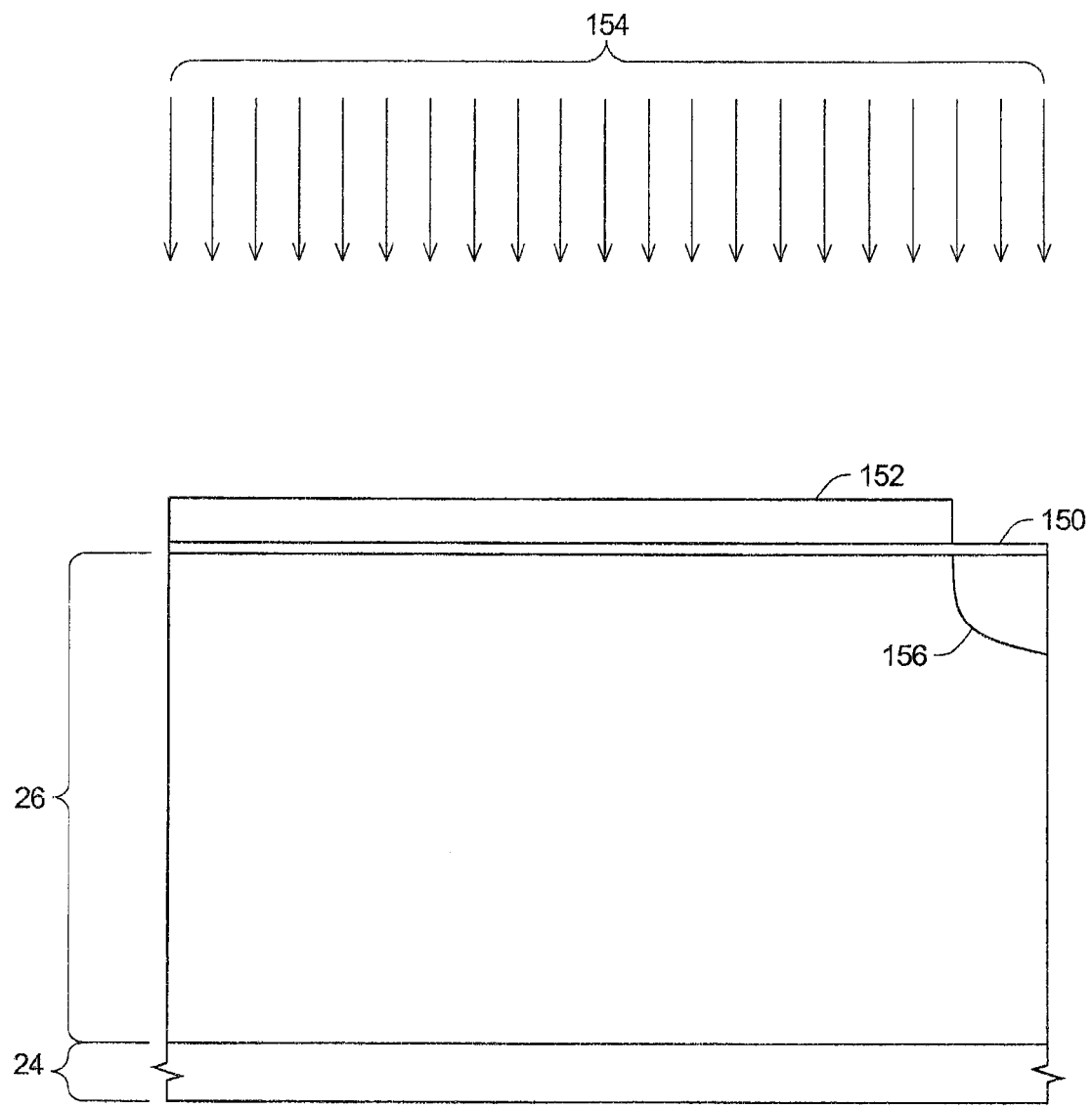
FIGS. 7A, 7B, 7C, 7D, 7E, 7F, 7G, and 7H are side diagrammatical views of the lateral MOSFET shown in FIG. 5 at selected processing stages in forming the lateral MOSFET of FIG. 5.

FIGS. 7A-7H are side diagrammatical views of the lateral MOSFET 20 at selected processing stages in one embodiment for forming the lateral MOSFET 20. In FIG. 7A, the substrate 24 is N+ doped with phosphorous, and may be red phosphorous. The first epitaxial layer 26 is arsenic doped to provide a buffer region between the heavily doped phosphorous substrate 24 and the second epitaxial layer 28 to isolate the up diffusion from the heavily doped phosphorous substrate 24 into the second epitaxial layer 28. In some embodiments the arsenic first epitaxial layer 26 without an up sinker provides an adequate conductivity path from the second epitaxial layer 28 to the substrate 24 and has a thickness depending on the extent of the diffusion from the substrate 24 which, in turn, depends on the thermal cycles during manufacture of the lateral MOSFET 20. In some other embodiments, the addition of an up sinker in the first epitaxial layer 26 provides sufficient reduction in Rsp to justify the extra processing shown in FIG. 7A. In FIG. 7A a sacrificial oxide layer 150 is formed over the first epitaxial layer 26, and a photoresist layer 152 is patterned to form an opening which will be under the opening for implantation of the sinker 38 shown in FIG. 7D. Arsenic is implanted, as indicated by the arrows 154 to form the up sinker 156. The up sinker 156 is annealed to repair the damage to the top surface of the first epitaxial layer 26 so that the second epitaxial layer will have a regular crystalline structure when grown on the first epitaxial layer 26.

Figure 7B:
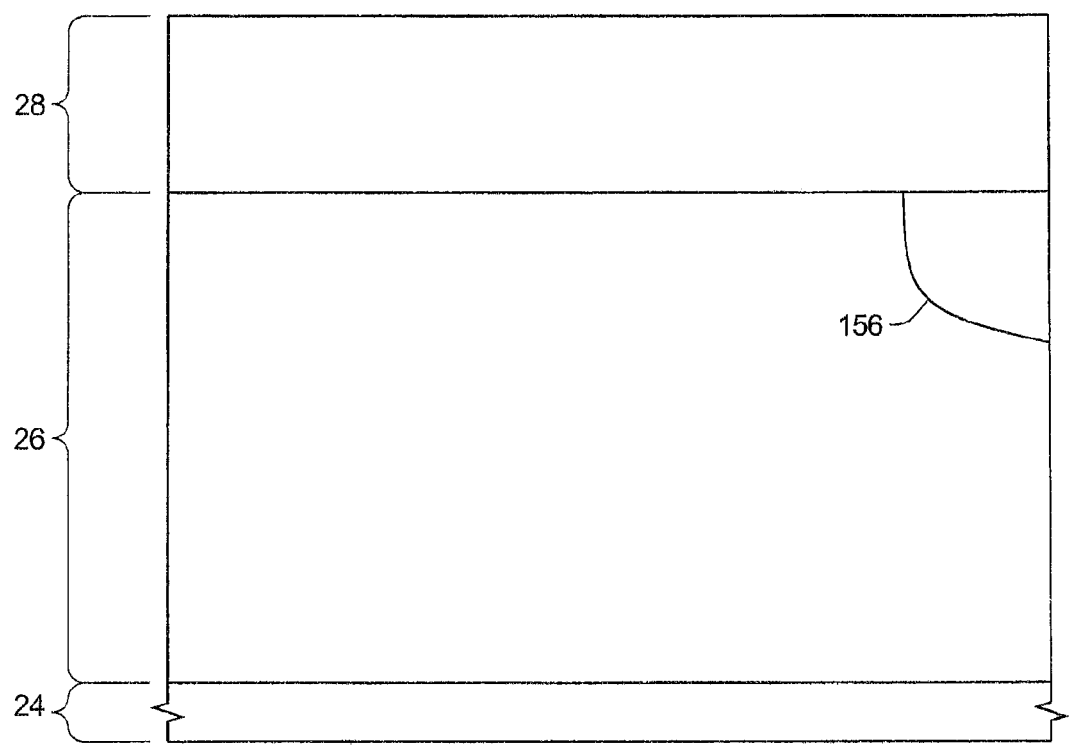

FIG. 7B shows the second epitaxial layer 28 after it has been grown on the first epitaxial layer 26. The second epitaxial layer 28 is lightly doped when it is formed, with most of the second epitaxial layer being further doped during subsequent processing of the device.

Figure 7C:
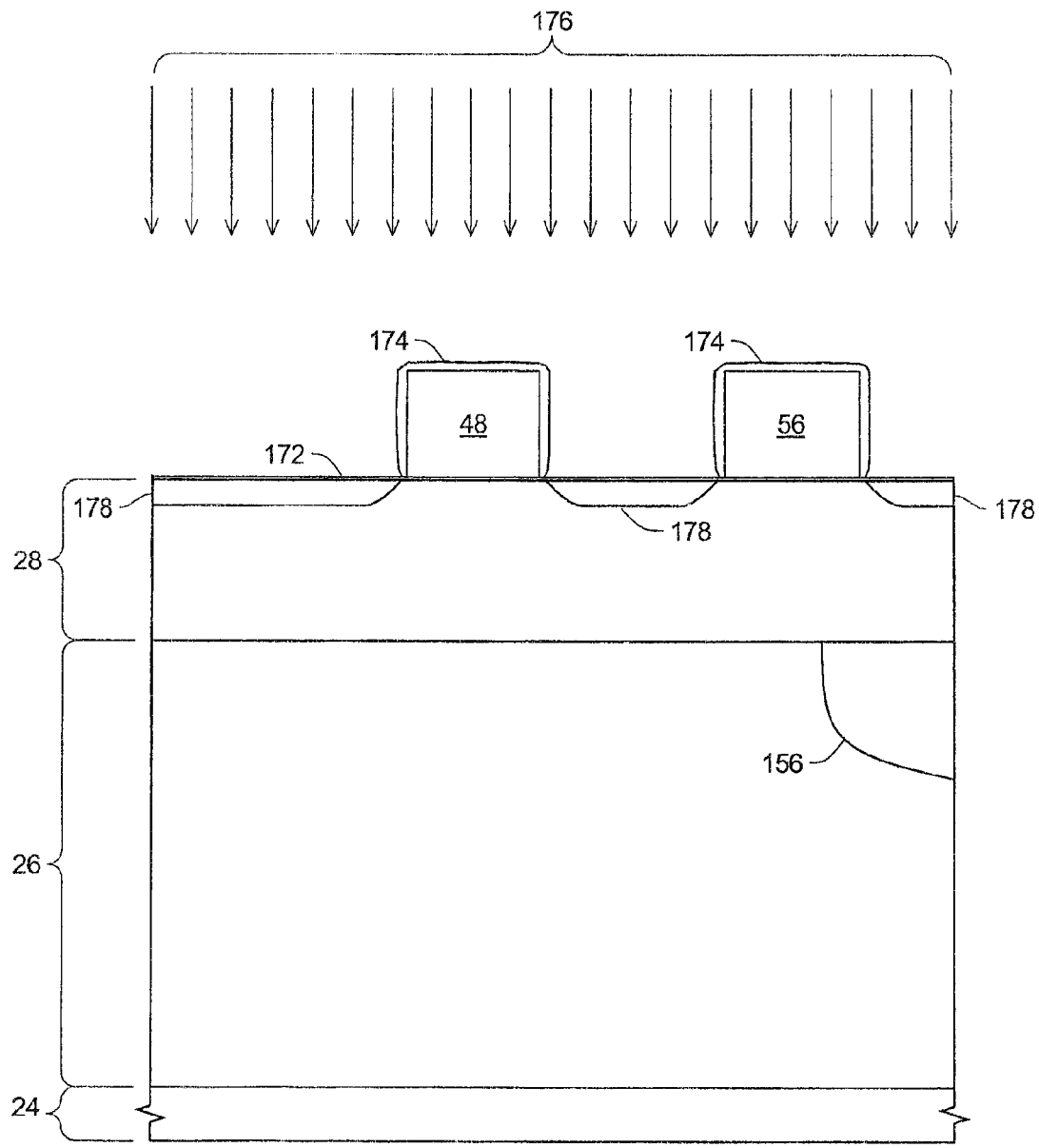

FIG. 7C shows the structure shown in FIG. 2A after a gate oxide 172 has been formed on the second epitaxial layer 28, and polysilicon has been deposited and patterned to form the active gate electrode 48 and the non-active gate electrode 56. Seal oxides 174, which may be a little thicker than the gate oxide 172, have been formed around the gate electrodes 48, 56. The seal oxides 174 are optional and, if used, the thickness is dependent upon subsequent implantation energies. Implantation of the N type dopants, indicated by arrows 176, form LDD regions 178. Although the LDD regions 178 are formed everywhere in the active regions not masked by the gate electrodes 48, 56 and the seal oxides 174, only a portion of the LDD region 36 (shown in FIG. 1) does not receive heavier concentrations of dopants in later processing.

Figure 7D:
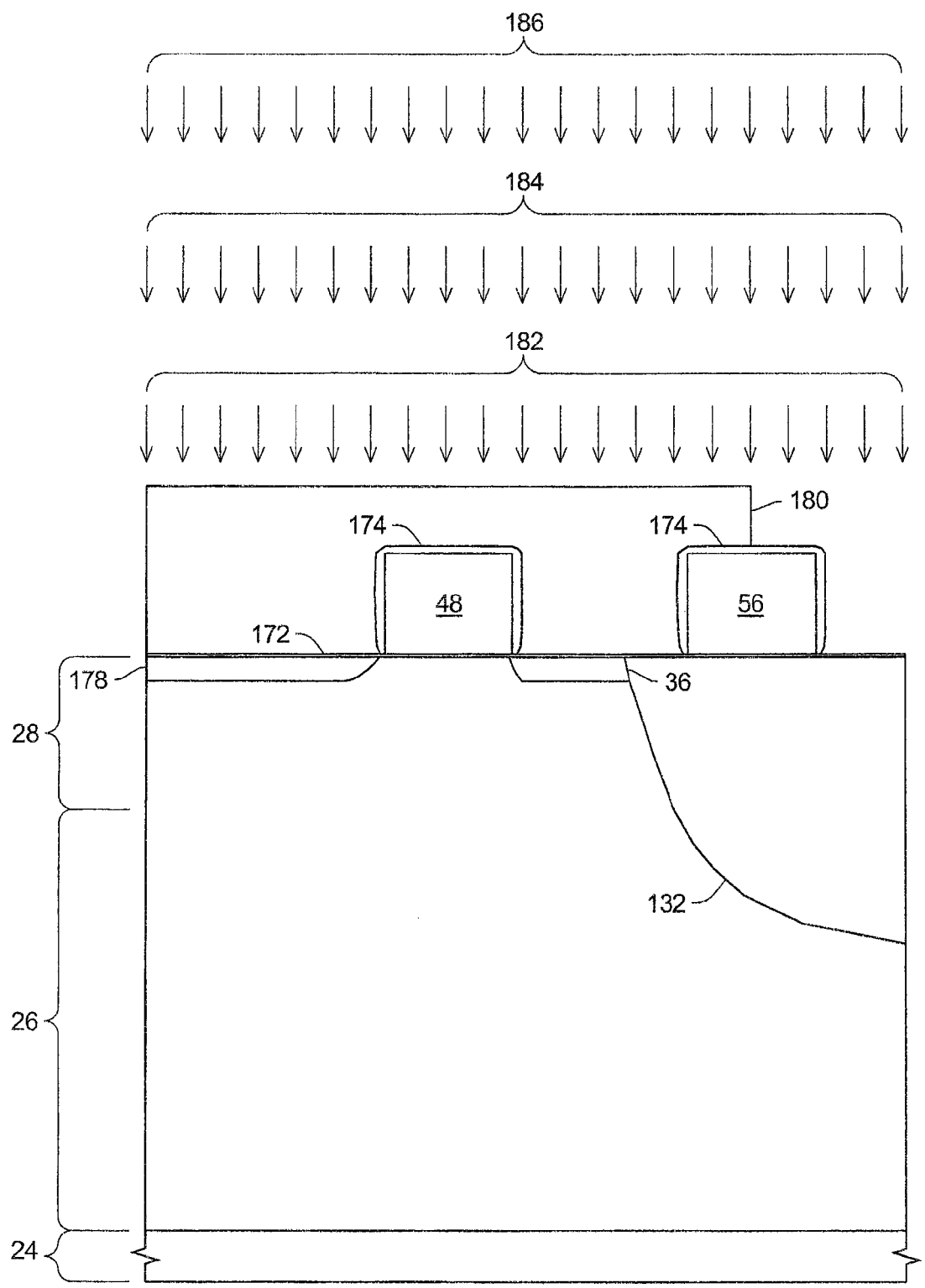

FIG. 7D shows a photoresist layer 180 used to complete the sinker 132 which is a combination of the sinker 38 formed in FIG. 1 in the second epitaxial layer 28 and the sinker 156 formed in FIG. 7A. The sinker portion 38 of the sinker 132 may be formed using up to three implants as indicated by the three sets of arrows 182, 184, and 186 in one or more embodiments of the present invention. The use of the non-active gate 56, the seal oxide 174 and the photoresist 180 allows relatively high implantation energies to form a uniform drain sinker region in the second epitaxial layer which has a relatively lower drain resistance than a drain sinker in the second epitaxial layer with a vertical dopant gradient such as formed by gaseous diffusion. With multiple implants the vertical dopant profile of the sinker in the second epitaxial layer may also increase from the top surface of the second epitaxial layer 28 to the lower region of the second epitaxial layer 28. Multiple implants allow the drain sinker in the second epitaxial layer to be deeper with less lateral width compared to a single implant and subsequent diffusion since pushing a single implant deeper causes more lateral spread of the final sinker in the second epitaxial layer and an increase in the resistivity of the sinker in the second epitaxial layer.

Figure 7E:
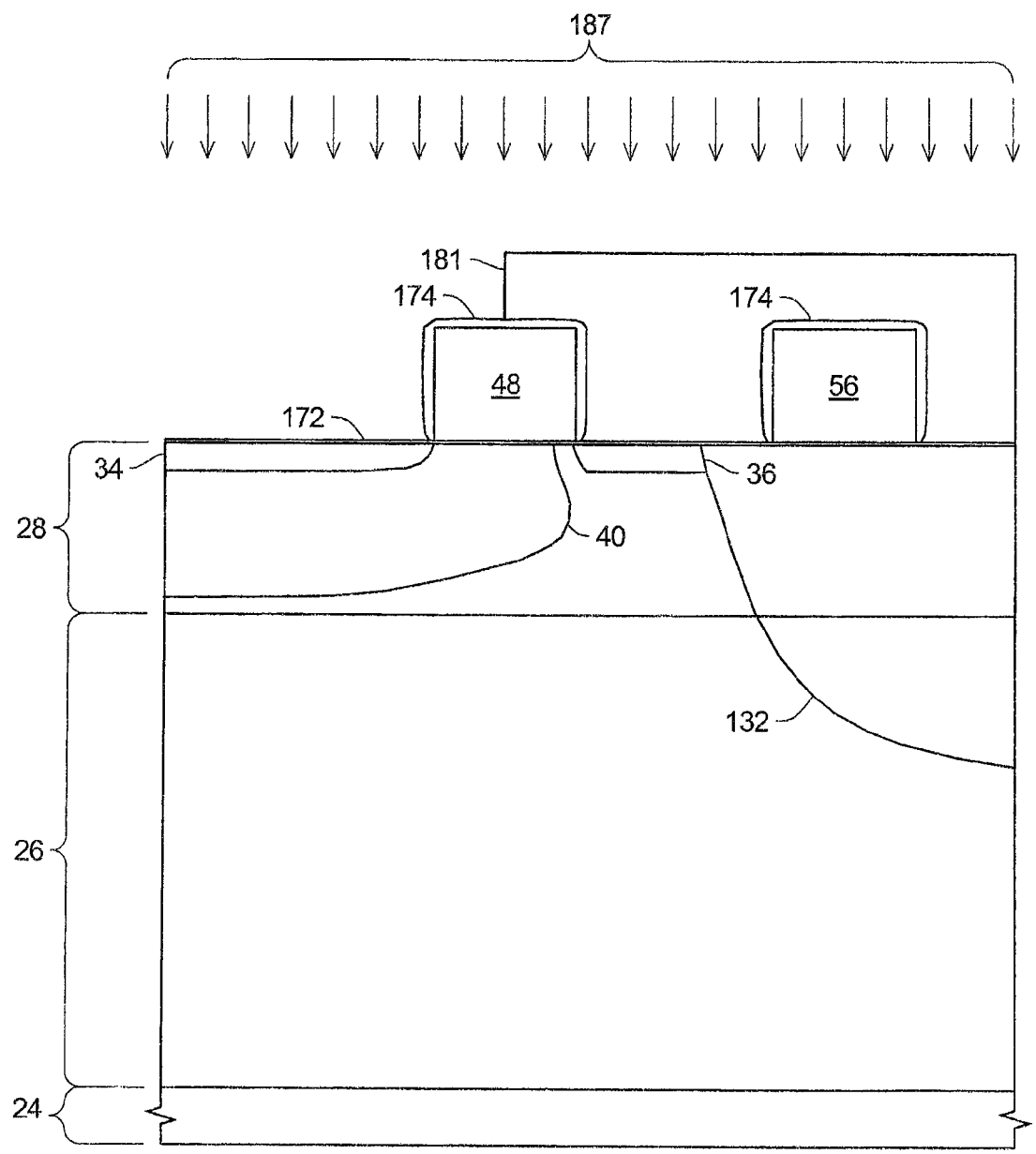

FIG. 7E shows a photoresist layer 181 that fills the gap between the gate electrodes 48, 56 and extends over the sinker implant 38 used to complete the P well 30. Formed in the upper portion of the second epitaxial layer 28 is the P well 30 which may be formed by gaseous diffusion, by a single implant, or by multiple implants indicated by arrows 187. The line 40 indicates the PN junction between the P well 30 and the N-type second epitaxial layer 28. The PN junction is adjusted by diffusion.

Figure 7F:
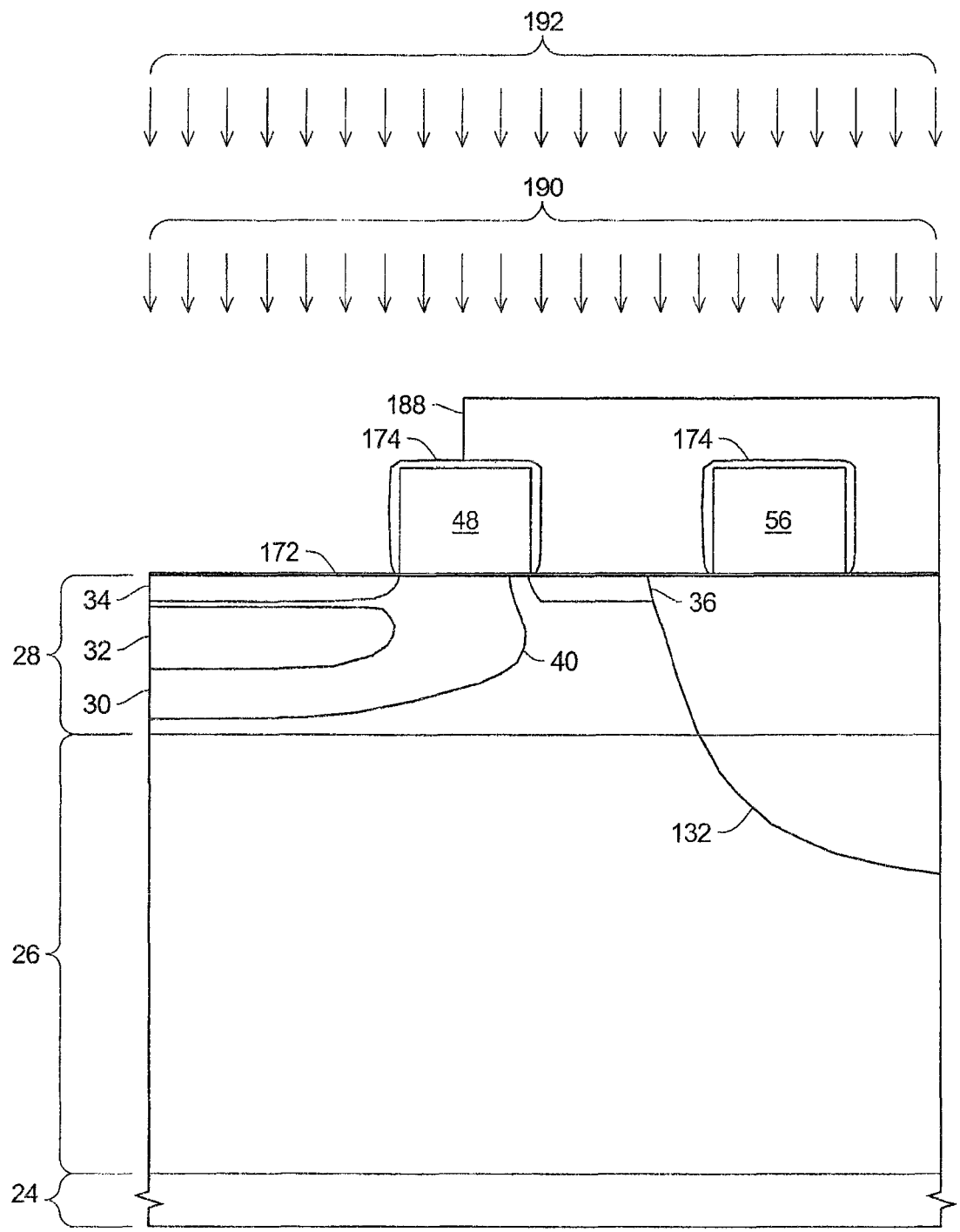

FIG. 7F shows process steps which may be used for forming the heavy P body 32 and the source region 34. A photoresist layer 188 fills the gap between the gate electrodes 48, 56 and extends over the sinker implant 38. The heavy P body 32 and the N type source region 34 are formed by the implantation of P-type dopants indicated by the arrows 190, and N-type dopants indicated by the arrows 192.

Figure 7G:
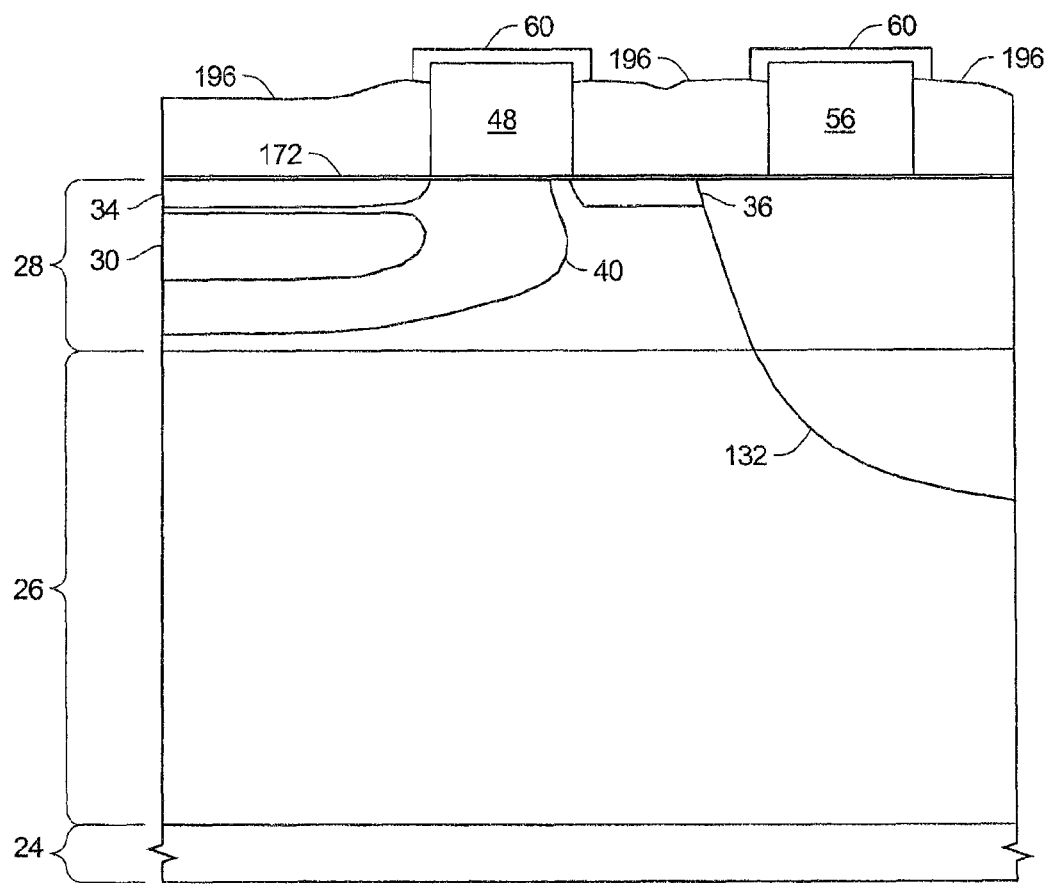

FIG. 7G shows a stage in the process of forming the lateral MOSFETs 20, 130 which may be used to form silicide on the gates 48, 56. A dielectric 196, which may be borophosphosilicate glass (BPSG), is formed on the upper surface of the epitaxial layer 28. The dielectric film may be planarized and then etched partially back such that the vertical height of the BPSG is the same as the height or slightly below the top surface of the active gate 44 to allow formation of the silicide layer 60 on the top of the active gate 48 in one process embodiment. The silicide layers may consist of Ti, Co, Pl, TiW, W, and other refractory metals or combinations thereof.

Figure 7H:
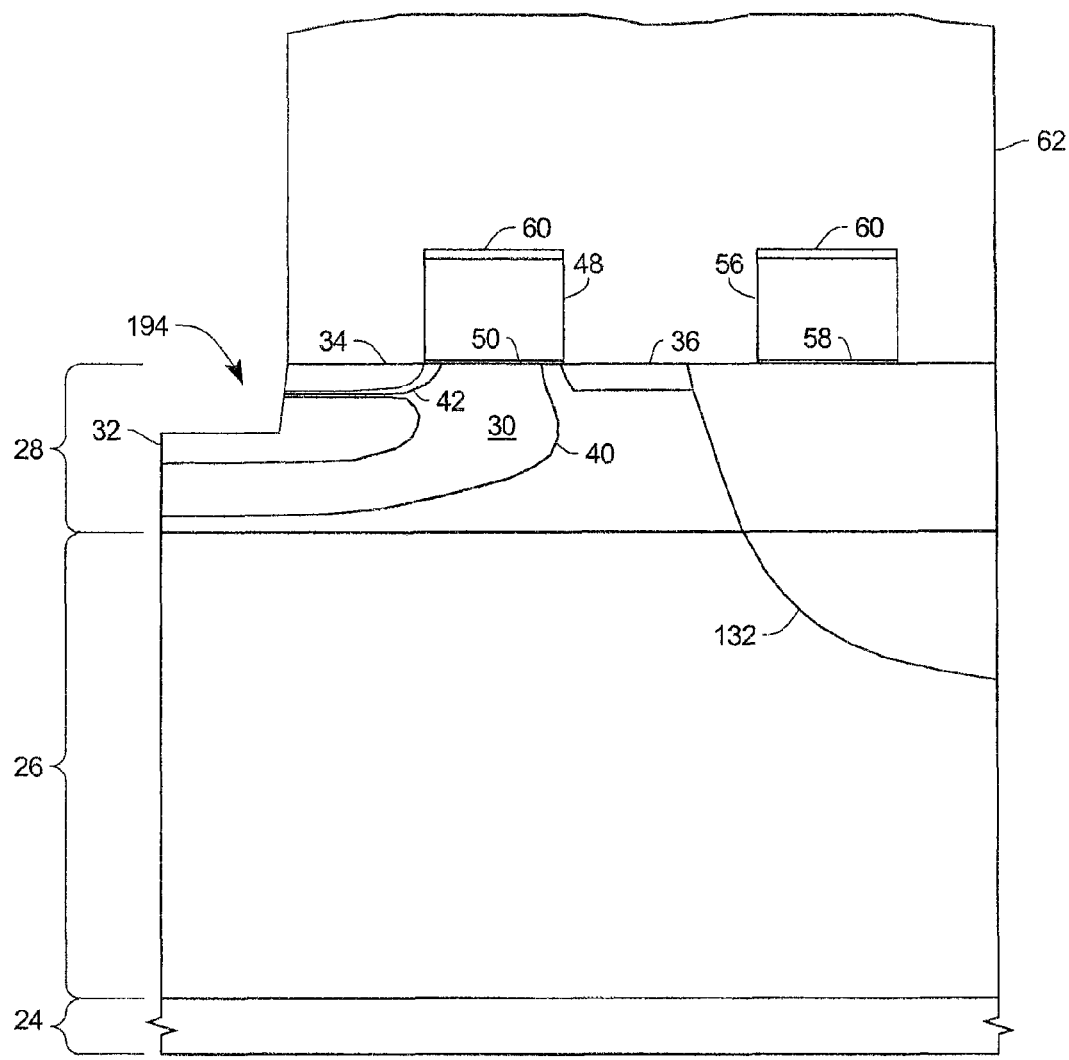

FIG. 7H shows the dielectric layer 62, such as a BPSG layer, formed on the upper surfaces of the second epitaxial layer 28, the silicide 60. An etched dimple 194 is formed on the left edge of the source region 34 and in an upper left portion of the heavy P body 32 by using a photo mask to remove the dielectric and etch the dimple 194. Metallization is then formed on the top and bottom of the structure shown in FIG. 7H to complete the lateral MOSFET 20 and 130.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A method for forming a lateral MOSFET comprising the steps of:
   growing a first epitaxial layer on a substrate, said first epitaxial layer and said substrate being of a first conductivity type;
   growing a second epitaxial layer on said first epitaxial layer;
   forming a gate electrode on a gate dielectric which in turn is formed on a top surface of said second epitaxial layer;
   forming a drain region of said first conductivity type in said second epitaxial layer which extends to a top surface of said epitaxial layer and is proximate to a first edge of said gate electrode;
   forming a source region of said first conductivity type in said second epitaxial layer which extends to a top surface of said second epitaxial layer and is proximate to a second edge of said gate electrode;
   forming a heavily doped body of a second conductivity type in said second epitaxial layer opposite to said first conductivity type under at least a portion of said source region; and
   forming a lightly doped well of said second conductivity type in said second epitaxial layer under said gate dielectric which extends to said heavily doped body;
   wherein a PN junction lying between said heavily doped body and said first epitaxial region under said heavily doped body defines a voltage clamping region, and a reverse bias voltage that is slightly less than a breakdown voltage applied to said PN junction in said voltage clamping region creates a depletion region that extends to a region of said first epitaxial layer in which the vertical dopant concentration is substantially constant.

2. The method of claim 1 wherein said second epitaxial layer further includes a first sinker in said drain region that is spaced apart laterally from said gate electrode.

3. The method of claim 2 wherein said first sinker extends downward into said first epitaxial layer.

4. The method of claim 1 wherein said reverse bias voltage that is slightly less than a breakdown voltage applied to said PN junction in said voltage clamping region creates a depletion region that extends to a region of said second epitaxial layer in which the vertical dopant concentration has a steep slope.

5. The method of claim 1 wherein said lightly doped well extends under said heavily doped body.

6. The method of claim 1 wherein the amount that the avalanche breakdown voltage that depends on the doping concentration in the upper portion of said first epitaxial layer that is beneath said heavily doped body and the amount that the avalanche breakdown voltage that depends on the thickness of said second epitaxial layer is less than an order of magnitude.

7. The method of claim 2 further including forming a second sinker in said first epitaxial layer under said first sinker prior to forming said second epitaxial layer.

8. A method for forming a lateral MOSFET comprising the steps of:
   growing a first epitaxial layer on a substrate, said first epitaxial layer and said substrate being of a first conductivity type;
   forming a first sinker in said first epitaxial layer in an area which will be under a drain region in a second epitaxial layer;
   growing said second epitaxial layer on said first epitaxial layer;
   forming a gate electrode on a gate dielectric which in turn is formed on a top surface of said second epitaxial layer;
   forming said drain region of said first conductivity type in said second epitaxial layer which extends to a top surface of said epitaxial layer and is proximate to a first edge of said gate electrode;
   forming a source region of said first conductivity type in said second epitaxial layer which extends to a top surface of said second epitaxial layer and is proximate to a second edge of said gate electrode;

forming a heavily doped body of a second conductivity type in said second epitaxial layer opposite to said first conductivity type under at least a portion of said source region;

forming a lightly doped well of said second conductivity type in said second epitaxial layer under said gate dielectric which extends to said heavily doped body; and forming a second sinker in said drain region that is spaced apart laterally from said gate electrode which extends downward into said first epitaxial layer;

wherein a PN junction lying between said heavily doped body and said first epitaxial region under said heavily doped body defines a voltage clamping region, and a reverse bias voltage that is slightly less than a breakdown voltage applied to said PN junction in said voltage clamping region creates a depletion region that extends to a region of said first epitaxial layer in which the vertical dopant concentration is substantially constant.

9. The method of claim 8 wherein said reverse bias voltage that is slightly less than a breakdown voltage applied to said PN junction in said voltage clamping region creates a depletion region that extends to a region of said second epitaxial layer in which the vertical dopant concentration has a steep slope.

10. The method of claim 8 wherein said lightly doped well extends under said heavily doped body.

11. The method of claim 8 wherein the amount that the avalanche breakdown voltage that depends on the doping concentration in the upper portion of said first epitaxial layer that is beneath said heavily doped body and the amount that the avalanche breakdown voltage that depends on the thickness of said second epitaxial layer is less than an order of magnitude.

* * * * *